(12) United States Patent
MacDonald (10) Patent No.: US 11,835,802 B2
(45) Date of Patent: Dec. 5, 2023

(54) LENS AND EYEWEAR (71) Applicant: HS Vision Ltd., Edinburgh (GB)

(72) Inventor: Alexander MacDonald, Swindon (GB)

(73) Assignee: HS Vision Ltd., Edinburgh (GB)

( * ) Notice: Subject to any disclaimer, the term of this patent is extended or adjusted under 35 U.S.C. 154(b) by 394 days.

(21) Appl. No.: 17/027,752

(22) Filed: Sep. 22, 2020

(65) Prior Publication Data

US 2021/0026161 A1  Jan. 28, 2021

Related U.S. Application Data (63) Continuation of application No. PCT/GB2019/050721, filed on Mar. 14, 2019.

(30) Foreign Application Priority Data

Mar. 26, 2018 (GB) ...................................... 1804838

(51) Int. Cl.
*G02C 7/14* (2006.01)
*G02C 5/02* (2006.01)

(52) U.S. Cl.
CPC  *G02C 7/14* (2013.01); *G02C 5/02* (2013.01)

(58) Field of Classification Search
CPC .................................. G02C 7/14; G02C 5/02
USPC ...................................................... 351/41, 50
See application file for complete search history.

(56) References Cited

U.S. PATENT DOCUMENTS

| 4,919,529 A * | 4/1990 | Hyun ..................... G02C 7/105 351/50 |
| 5,416,536 A | 5/1995 | Tee, Jr. |
| 6,076,924 A * | 6/2000 | Wysocki .................. G02C 7/14 351/50 |
| 11,256,111 B2 * | 2/2022 | Fongen .................... G02C 7/14 |
| 2014/0036220 A1 | 2/2014 | Ashiogwu |

FOREIGN PATENT DOCUMENTS

| CN | 2375976 Y | 4/2000 |
| CN | 2798133 Y | 7/2006 |
| CN | 104834110 A | 8/2015 |
| CN | 204631384 U | 9/2015 |
| DE | 29802302 U1 | 4/1998 |
| FR | 1110042 A | 2/1956 |
| FR | 2822964 A1 | 10/2004 |
| GB | 302833 A | 12/1928 |
| GB | 2361407 A | 10/2001 |

OTHER PUBLICATIONS

International Search Report, International Application No. PCT/GB/2019/050721 dated May 29, 2019.
Written Opinion of the International Search Authority, International Application No. PCT/GB/2019/050721 dated May 29, 2019.
First Office Action Report, Chinese Patent Application No. 201980021789.X dated Feb. 7, 2022.

(Continued)

*Primary Examiner* — Tuyen Tra
(74) *Attorney, Agent, or Firm* — Richard A. Fagin (57) ABSTRACT

Disclosed are lenses and eyewear that provide the user with both forward vision and rearward vision by means of an angled, reflective portion of the lens.

19 Claims, 6 Drawing Sheets

(56) References Cited

OTHER PUBLICATIONS

Translation of First Office Action Report, Chinese Patent Application No. 201980021789.X dated Feb. 7, 2022.
Combined Search and Examination Report, British Application No. GB2013474.9 dated Sep. 10, 2021.
Examination report, British Application No. GB1903500.5 dated Feb. 28, 2020.

* cited by examiner

LENS AND EYEWEAR

CROSS REFERENCE TO RELATED APPLICATIONS

Continuation of International Application No. PCT/GB2019/050721 filed on Mar. 14, 2019. Priority is claimed from British Patent Application No. 1804838.9 filed on Mar. 26, 2018. Both the foregoing applications are incorporated herein by reference in their entirety.

STATEMENT REGARDING FEDERALLY SPONSORED RESEARCH OR DEVELOPMENT

Not Applicable.

NAMES OF THE PARTIES TOA JOINT RESEARCH AGREEMENT

Not Applicable

TECHNICAL FIELD

The present invention relates to lenses and eyewear that provide the user with both forward vision and rearward vision.

BACKGROUND

Typically, eyewear (e.g. spectacles, goggles etc.) comprise transparent or translucent lenses through which the user can observe the environment in front of them. In some situations, it is also useful for the user to see the environment behind them. Eyewear that provides both forward and rearward vision is particularly useful for cyclists. When cycling, it is important for the cyclist to be aware of their surroundings. This includes being able to see behind them. There is a need for provision of rearward vision in order to see, for example, cars or traffic approaching from the rear, or to see that their fellow cyclists are following them. In competitive cycling, there is a desire to have rearward vision to be able to identify approaching competitors. Typically, cyclists will turn their head and bodies in order to see behind them; however, in some cases this can result in off-balancing and can be dangerous for the cyclist and others around them, particularly when the cyclist is travelling at high speeds.

Currently, it is known in the art to provide rearward vision by modifying eyewear to include a mirror or a reflective portion. These prior art devices can generally be categorised into two main categories. The first of these relates to glasses having one or more mirrors attached externally to, and protruding from, the outer frame of the glasses. These mirrors are provided completely separate from the lenses of the eyewear, which are transparent or translucent for forward vision. The problem with these external mirrors is that they add to the size of the eyewear, are at risk of breaking off the frame, and may be accidently knocked or moved out of an optimal position. They are also not particularly suited to the needs and requirements of cyclists or active sportsmen. This is because the externally protruding mirrors make the wearer less aerodynamic, and windy conditions may inadvertently change the angle at which the mirrors are positioned. Furthermore, collisions or falls may result in breakage of the appended mirrors, which would render the eyewear ineffective and could pose a hazard to the wearer.

Alternatively, eyewear having a reflective coating applied to a peripheral portion of a typical transparent or translucent lens is also known, wherein the reflective coating provides rearward vision for the wearer if they look in the direction of the reflective coating. These prior art devices are typically sold as novelty items and have not been found to provide rearward vision which is sufficiently clear or with a useful field of vision for the wearer, especially for use during serious activities, such as cycling.

Aspects of the present invention attempt to address at least some of the issues with the prior art and provide simpler, more convenient and more effective eyewear for forward and rearward vision.

STATEMENTS OF INVENTION

In accordance with a first aspect of the present invention, there is provided a lens for eyewear, wherein the curvature of the lens has a discontinuity, the discontinuity defining a first portion (or inner portion, that is, closest to the nose in use) of the lens on one side of the discontinuity, and a second portion (or outer portion, that is, furthest from the nose in use) of the lens on another side of the discontinuity, the second portion thereby being angled relative to the first portion; wherein the first portion is transparent or translucent and the second portion has a reflective side being at least partially reflective; and wherein the angle between the surface on the reflective side of the second portion and an adjacent surface of the first portion is obtuse (i.e. between 90° and 180°).

The first aspect of the invention thus provides a lens having a transparent or translucent portion for forward-vision, and a portion that is at least partially reflective for rearward-vision. The lens is conveniently a single lens that is capable of providing both forward and rearward vision, thereby eliminating the need for separate mirrors and lenses. The portion for rearward-vision is also conveniently angled relative to the portion for forward-vision, which provides an optimal view to the rear.

Typically, the first and second portions are integral in the same lens. However, it is envisioned that the same advantaged may be achieved by retro-fitting the second portion to an existing lens, either temporarily or permanently. For example, by means of adhesive or alternatively by means of a clip or other reversible attachment means.

Although the lens is described as having a curvature, this does not limit the first portion and second portion to being curved. Instead, the first portion and/or the second portion may be flat (i.e. having a curvature of 0). In this case, the first portion and the second portion may be described as being generally planar, wherein the plane of the first portion intersects the plane of the second portion at the discontinuity (i.e. the first portion and the second portion do not extend in the same plane).

The term "discontinuity" is intended to indicate a relatively sharp, distinct change in the curvature of the lens so as to define two portions that are angled relative to each other. The first and second portions may be chamfered next to the discontinuity so that the boundary between the first and second portions is not a sharp edge.

The angle between the surface on the reflective side of the second portion and the adjacent surface of the first portion may be at least 100°, at least 105°, at least 110°, at least 115°, at least 120°, at least 125°, at least 130°, at least 135°, at least 140°, at least 145°, at least 150°, at least 155°, at least 160°, at least 165°, at least 170°, or at least 175°. The angle may be up to 179.5°. In an embodiment, the angle is in the range 160° and 170°, such as 161, 162, 163, 164, 165, 166, 167, 168 or 169°. In another embodiment, the angle is about 165°, such as 164.1, 164.2, 164.3, 164.4, 164.5, 164.6, 164.7, 164.8 or 164.9°. In another embodiment, the angle is 164.5°. This angle has been found to provide one particularly effective field of view to the rear.

About or approximately as employed herein means±10%.

The discontinuity may be substantially linear (i.e. a straight line) for ease of manufacture. Typically, the discontinuity is substantially vertical, in use.

Alternatively, the discontinuity may be non-linear, e.g. curved, so as to define shaped areas for providing a good balance between the areas for forward vision and rearward vision.

The discontinuity may extend across the whole height of the lens (i.e. extend between two opposing edges of the lens), which allows for maximal reflective surface area for the second portion for providing a more complete picture of the rear environment. Alternatively, the discontinuity may extend across less than the whole height of the lens, such as at least 25% of the height of the lens. In some embodiments the discontinuity extends at least 50% or at least 75% of the height of the lens. Typically, the discontinuity extends across the middle section of the height of the lens.

The surface area of the second (or outer) portion on the reflective side (or inner side, in use) may be up to about 50% of the total surface area of the lens on the reflective side (i.e. the surface area of the second portion on the reflective side plus the surface area of the adjacent surface of the first portion). The surface area of the second (or outer) portion may be at least 5%, at least 10%, at least 15%, at least 20%, at least 25%, at least 30%, at least 35%, at least 40%, or at least 45% of the total surface area of the lens on the reflective side. In an embodiment, the surface area of the second portion on the reflective side may be in the range about 20-40% of the total surface area of the lens on the reflective side, such as about 21, 22, 23, 24, 25, 26, 27, 28, 29, 30, 31, 32, 33, 34, 35, 36, 37, 38 or 39%. In an embodiment, the surface area of the second portion on the reflective side may be in the range about 20-35% of the total surface area of the lens on the reflective side. The surface area of the second portion should not be so large as to obstruct the user's forward view, but should not be so small as to make it difficult to see the rear view.

The skilled person will appreciate that the amount of the total surface area that is reflective is dependent on a range of factors including lens size, lens shape, lens curvature and personal taste, etc.

The reflective side of the second portion may be reflective by way of a reflective coating on the second portion. The reflective coating may cover the whole of the reflective side of the second portion. Alternatively, the reflective coating may only partially cover the reflective side of the second portion. In this case, the remaining portion of the second portion that is not covered by the reflective coating may be transparent or translucent. For example, the reflective coating may cover up to 10%, 20%, 30%, 40%, 50%, 60%, 70%, 80% or 90% of the surface area of the second portion on the reflective side. For example, at least 10%, at least 15%, at least 20%, at least 25% or at least 50% of the surface area of the second (or outer) portion.

The lens may comprise a filter for blocking particular wavelengths of light, e.g. UV wavelengths. Thus, the lens may be suitable for use in sunglasses.

The shape of the lens may be shaped according to typical lens shapes in the industry, for example, generally circular, oval, square, rectangular or teardrop shapes. Due to the discontinuity in the curvature, the lens may not look like perfect versions of these shapes. However, the lens may generally look like one of these shapes when viewed along the optical axis.

In accordance with a second aspect of the invention, there is provided eyewear comprising at least one lens according to the first aspect of the invention; and a frame configured to support the or each lens such that the first portion is located toward a central region of the frame (that is, closest to the nose, in use), the second portion is located toward a peripheral region of the frame (that is, furthest from the nose, in use), and the second portion is angled toward the wearer relative to the first portion when in use, such that the reflective side of the second portion faces the wearer in use.

The second aspect of the invention thus provides eyewear (e.g. spectacles, goggles, a viewing portion of a helmet etc.) incorporating at least one lens of the first aspect of the invention, which allows the wearer to conveniently position the lens in front of their face for forward and rearward viewing.

The lens may be supported by the frame such that the discontinuity is orientated substantially vertically with respect to the wearer when in use.

The or each lens may be releasably supported by the frame. This allows a user to conveniently change lenses. For example, a user may change a lens having a completely transparent first portion with a lens having a filtered first portion when going outside in bright daylight.

The or each lens may be photochromic, anti-fog, polarised or prescription lenses as required by the user.

The eyewear may comprise two lenses according to the first aspect of the invention arranged symmetrically about the central region of the frame. This embodiment conveniently provides both eyes of the user with forward and rearward vision and may allow the user to see behind them on the left or right side of their body.

The eyewear may further comprise a nose-bridge member arranged in the central region of the frame, wherein each lens is arranged on opposing sides of the nose-bridge member. In use, the nose-bridge member allows the eyewear to be supported on the bridge of the wearer's nose so that the eyewear is securely supported and positioned at an appropriate distance away from the wearer's face.

The nose-bridge member may be releasably attachable to the frame. This allows the user to conveniently swap between different nose-bridge members, e.g. between nose-bridge members made of different materials or having different shapes or profiles.

The eyewear may further comprise securing means for securing the frame to a wearer's head in use. For example, the securing means may comprise a pair of arms hingedly mounted to the frame for extending over the ears of the wearer when in use. Alternatively, the securing means may comprise an elasticated band or a helmet.

Typically, the securing means are situated in a position on the eyewear that does not hinder the users view behind them. That may be towards the top of the lenses in use, for example.

BRIEF DESCRIPTION OF THE DRAWINGS

Aspects of the invention will now be described by way of example only, and with reference to the accompanying drawings, in which.

DETAILED DESCRIPTION

Directional descriptors, for example, top, bottom, inner, outer, forward and rearward, etc., have been used throughout the following description to refer to the exemplary embodiments of the present invention as oriented in the preferred way during use, and as illustrated in the drawings. However, it will be apparent to those skilled in the art that the embodiments described hereinafter may be oriented in different ways than those illustrated and described. As such the directional descriptors are not intended to be limiting but are used for the purpose of description only.

Figure 1:
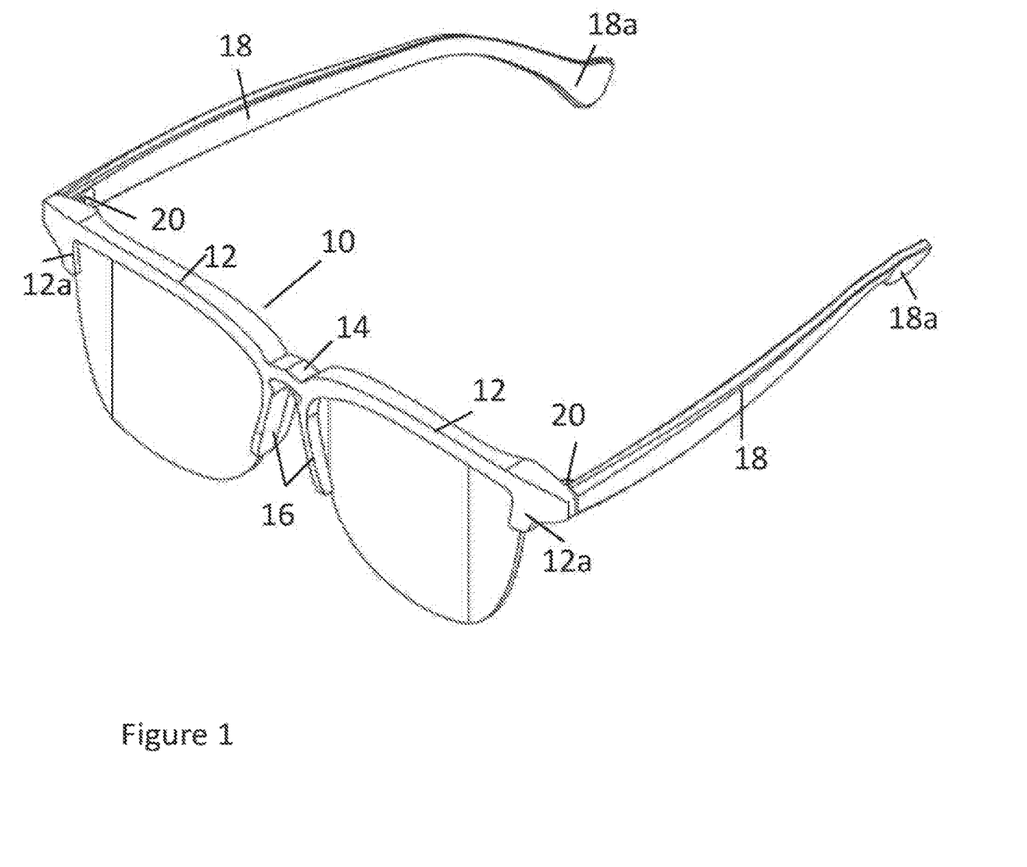
FIG. 1 is a schematic front perspective diagram showing eyewear according to a first exemplary embodiment of the invention.

Referring to FIG. 1 of the drawings, there is provided eyewear having a frame, indicated generally at 10. The frame 10 comprises a pair of lens supports 12 connected by a nose-bridge member 14 at a central region of the frame 10. The nose-bridge member 14 has a pair of bridge pads 16 which extend away and generally downward from the nose bridge member 14. The bridge pads 16 are configured to sit either side of the bridge of the nose of the wearer during use, and the nose-bridge member 14 is configured to rest on top of or above the bridge of the nose. The bridge pads 16 may be formed of, for example, a plastic material or a silicone material for comfort of the user, and may be textured so as to provide frictional engagement with the wearer's nose-bridge during use. Other suitable alternative materials known in the art may be used.

The lens supports 12 extend away from the nose-bridge member 14 in opposite directions. Each lens support 12 has a hooked portion 12a at their respective distal ends (i.e. furthest from the nose-bridge member 14).

Figure 2:
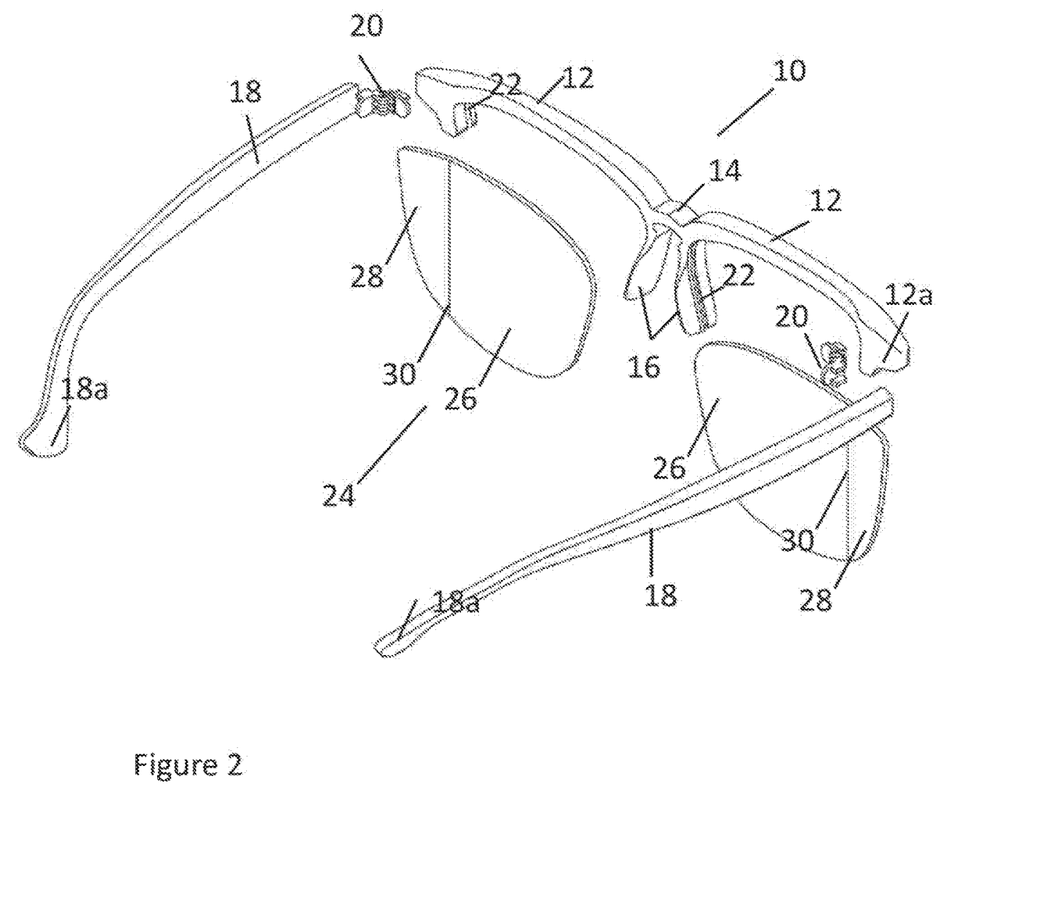
FIG. 2 is a schematic diagram illustrating an exploded view of the components of the eyewear of FIG. 1.

Referring additionally to FIG. 2 of the drawings, the lens supports 12 have a channel 22 along the inner surface thereof. This channel 22 extends from the edge of the hooked portion 12a of each lens support 12, along the lens support 12 and downwardly along the length of the inner surface of the bridge pads 16. The hooked portions 12a, lens supports 12, and bridge pads 16 are all shaped and configured to enable the channel 22 to receive and retain a lens.

At the outer edges of the lens supports 12, a securing means for holding the frame against a wearer's face during use is illustrated. In the present exemplary embodiment, the securing means is a pair of hingedly mounted arms 18. The arms 18 are hingedly mounted to the frame 10 by hinges 20. The arms 18 are shaped and configured to hook behind the wearer's ears, during use. In the present exemplary embodiment, this is achieved by providing each arm 18 with a bent portion 18a toward their distal end (i.e. the end furthest away from the frame 10).

Figure 3:
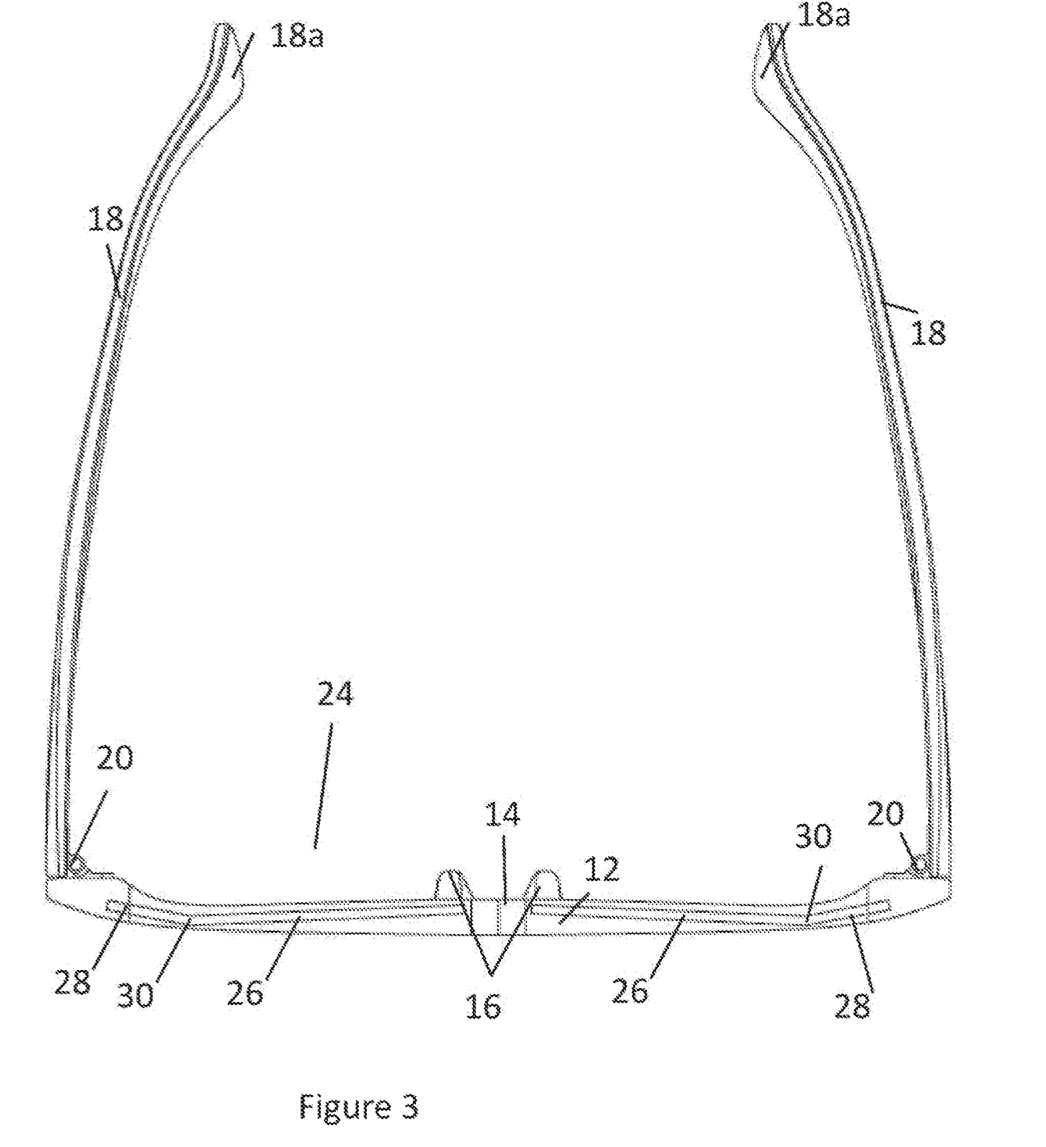
FIG. 3 is a schematic diagram illustrating a top view of the eyewear of FIG. 1.

It will be understood by the person skilled in the art that suitable means for holding the frame against a wearer's face during use may vary from the arms as illustrated in FIGS. 1, 2 and 3. For example, an elasticated band provided to wrap around the back of the wearer's head may also be a suitable means for holding the frame against a wearers face, during use. Alternatively, the frame may be part of a helmet or indeed the lens or lenses maybe attached directly to the helmet. Other suitable means may be known in the art and the present invention is not intended to be limited in this regard.

In the present exemplary embodiment, the eyewear further comprises a pair of lenses, generally indicated at 24. There is a single lens 24 either side of the nose-bridge member 14. Each lens 24 comprises a first portion 26, which is transparent or translucent. This allows the transmission of photons through the whole thickness of the forward-viewing portion 26 of the lens 24 so that, in use, the wearer is able to see through the forward-viewing portion 26 to view the environment in front of them. The first portion 26 will henceforth be referred to as forward-viewing portion 26 for ease of reference. The forward-viewing portion 26 may be completely clear, or may include a tint or filter. The forward-viewing portion 26 may also provide vision correction for users who require prescription glasses to see clearly (e.g. users with myopia, hyperopia or astigmatism).

Each lens 24 further comprises a second portion 28 which has a reflective coating applied thereon. The second portion 28 will henceforth be referred to as rearward-viewing portion 28 for ease of reference. The reflective coating need not be fully reflective. Indeed, it may be only partially reflective such that a portion of incident photons are reflected, and a portion are permitted to transmit through the rearward-viewing portion 28 of the lens 24. Alternatively, the rearward-viewing portion 28 may be completely reflective so 100% of incident photons are reflected. The rearward-viewing portion 28 may also comprise a tint or filter (e.g. as a coating on the opposite side of the lens to the reflective side). This is particularly useful for reducing glare or to bring the brightness of the rearward view to the same level as the brightness of the forward view.

The whole front surface of the lens (i.e. the surface of the first portion and the second portion that faces forward when the eyewear is worn) may have a tint or filter.

The forward-viewing portion 26 (or first portion) of each lens 24 is positioned toward a central region of the frame 10 (i.e. toward the nose-bridge member 14) and the rearward-viewing portion 28 (or second portion) of each lens 24 is positioned toward a peripheral region of the frame 10 (i.e. rearward-viewing portion 28 is positioned further away from nose-bridge member 14 than forward-viewing portion 26). Thus, when the wearer is looking straight ahead, the wearer will generally be looking through the forward-viewing portion 26 of each lens 24. When the wearer wants to view the environment behind them, the wearer may direct their eyes to the reflective coating on the rearward-viewing portion 28 of one of the lenses 24. It will be understood by those skilled in the art that the rearward-viewing portion provides specular reflection, rather than diffuse reflection, so as to provide the wearer with a clear image of the rear environment.

The reflective coating may be provided on the rearmost surface of the lens (i.e. the surface adjacent the wearer's face, during use), or on the forwardmost surface of the lens. If the reflective coating is provided on the forwardmost surface of the lens, photons will travel through the lens via the rearmost surface of the lens before they are reflected back toward the wearer's eyes. As such, the rearward-viewing portion 28 may be manufactured so as to utilise and manipulate the refractive properties of the lens material. This could help to optimise the path of photons to provide a clear image to the wearer. For example, the rearward-viewing portion of the lens may be manufactured to provide magnification (negative or positive) or focal length adjustment of the image shown in the reflective coating, as seen by the wearer. Furthermore, the lens material may comprise a filter at the rearward-viewing portion 28 which reduces glare from bright lights (e.g. car headlights).

In the illustrated example of FIGS. 1, 2, and 3 of the drawings, the rearward surface area of the rearward-viewing portion is approximately 20% of the rearward surface area of the overall lens, however it will be apparent to those skilled in the art that other proportions would be suitable and the invention is not intended to be limited in this regard. In particular the rearward surface area of the rearward-viewing portion may be as small as 5% of the rearward surface area of the overall lens, and up to about 50% of the rearward surface area of the overall lens.

Referring additionally to FIG. 3 of the drawings, the curvature of each lens 24 has a discontinuity 30. The discontinuity 30 defines the boundary between the forward-viewing portion 26 and the rearward-viewing portion 28 and runs vertically along the whole height of the lens from the top of the lens 24 (i.e. where the lens 24 is received and retained by the frame 10) to the bottom of the lens 24, in a substantially linear fashion. In alternative embodiments, the discontinuity 30 may be curved or irregularly shaped for optimal forward and rearward viewing. The discontinuity 30 provides a distinct bend in each lens, such that the rearward-viewing portion 28 is angled relative to the forward-viewing portion. This is illustrated best in FIG. 3 of the drawings. The angle $\alpha$ between the rearmost surface of the rearward-viewing portion 28 and the adjacent rearmost surface of the forward-viewing portion 26 is obtuse. In this particular exemplary embodiment, angle $\alpha$ is between about 160° and 170°, however it will be apparent to those skilled in the art that other angles would be suitable and the invention is not intended to be limited in this regard.

Each lens 24 is described above as have a "curvature", however it will be clear to those skilled in the art that the curvature of the lens may be zero, such that the forward-viewing portion 26 and rearward-viewing portion 28 are generally flat and planar, but do not extend in the same plane. In this particular exemplary embodiment, the forward-viewing portion 26 and the rearward-viewing portion 28 are flat, and the plane of the forward-viewing portion 26 intersects the plane of the rearward-viewing portion 28 at the discontinuity 30. Therefore, regardless of whether the lens is curved or flat, there is always present a significant bend in the lens at the discontinuity 30 separating the rearward-viewing portion 28 and the forward-viewing portion 26.

During use, the rearward-viewing portion 28 is angled toward the wearer's face and the reflective coating is facing the wearer. This directs incoming photons from behind the wearer to reflect back into the eyes of the wearer so that the wearer can see an image of the rear environment in the rearward-viewing portion.

The shape of each lens 24 in this particular exemplary embodiment is generally oval shaped. However, it will be apparent to those skilled in the art that other shapes would be suitable and the invention is not intended to be limited in this regard. Some shapes of lens may be better suited to different activities, for example, an elongate teardrop shape, wherein the tip of the teardrop points towards the users ears (when worn) may be more streamlined and better suited to activities where air resistance is an important factor (e.g. cycling).

The lenses 24 and the frame 10 are frictionally engaged with each other via the channel 22. In one exemplary embodiment of the invention, the lenses 24 are removably fitted within the frame 10 so that the lenses may be interchanged. For example, the lenses may be replaced if they get scratched or broken, or if the user wishes to swap clear lenses for tinted lenses, etc.

The rearward-viewing portion 28 and the forward-viewing portion 26 may be formed integrally as a single lens from one piece of material. Alternatively, the rearward-viewing portion 28 and the forward-viewing portion 26 may be formed separately and joined or fused together at the desired angle to form a single lens. In either case, the reflective coating may be applied to the rearward-viewing portion after forming the lens. The lens may be made from any suitable material known to those skilled in the art, e.g. glass or Perspex.

Figure 4:
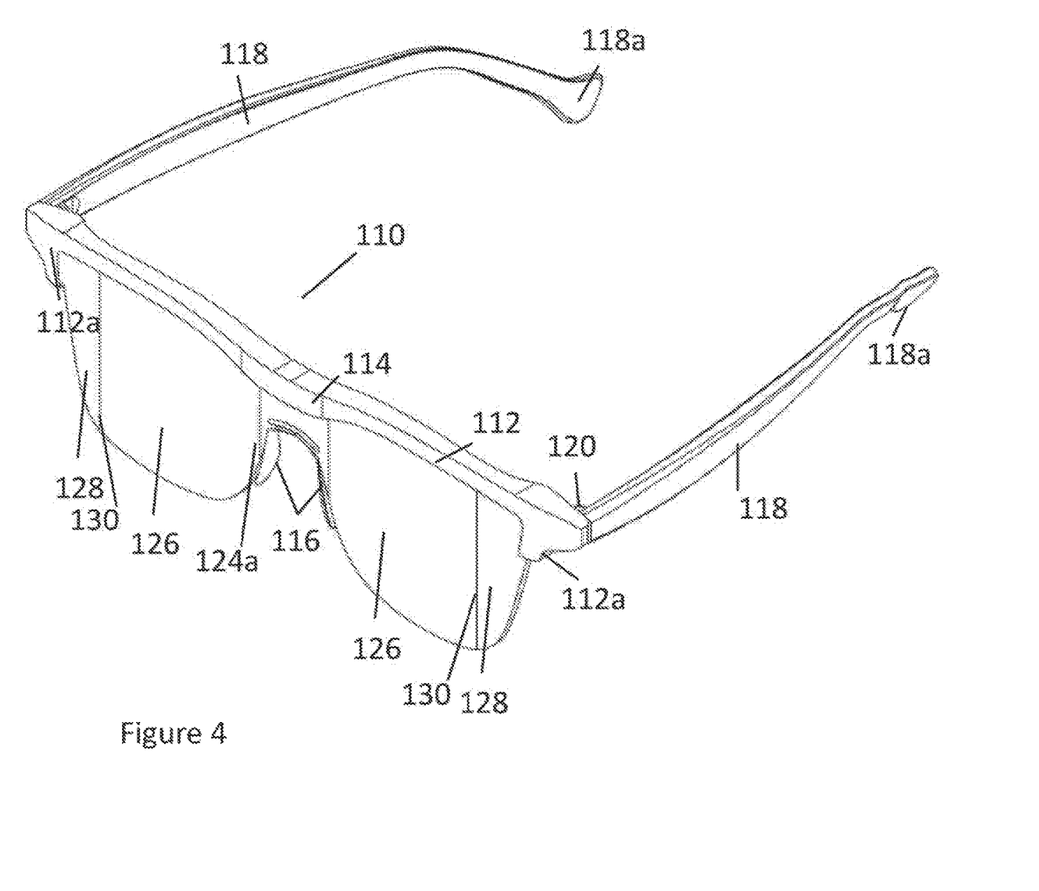
FIG. 4 is a schematic diagram illustrating a front perspective view of eyewear according to a second exemplary embodiment of the invention.
Figure 5:
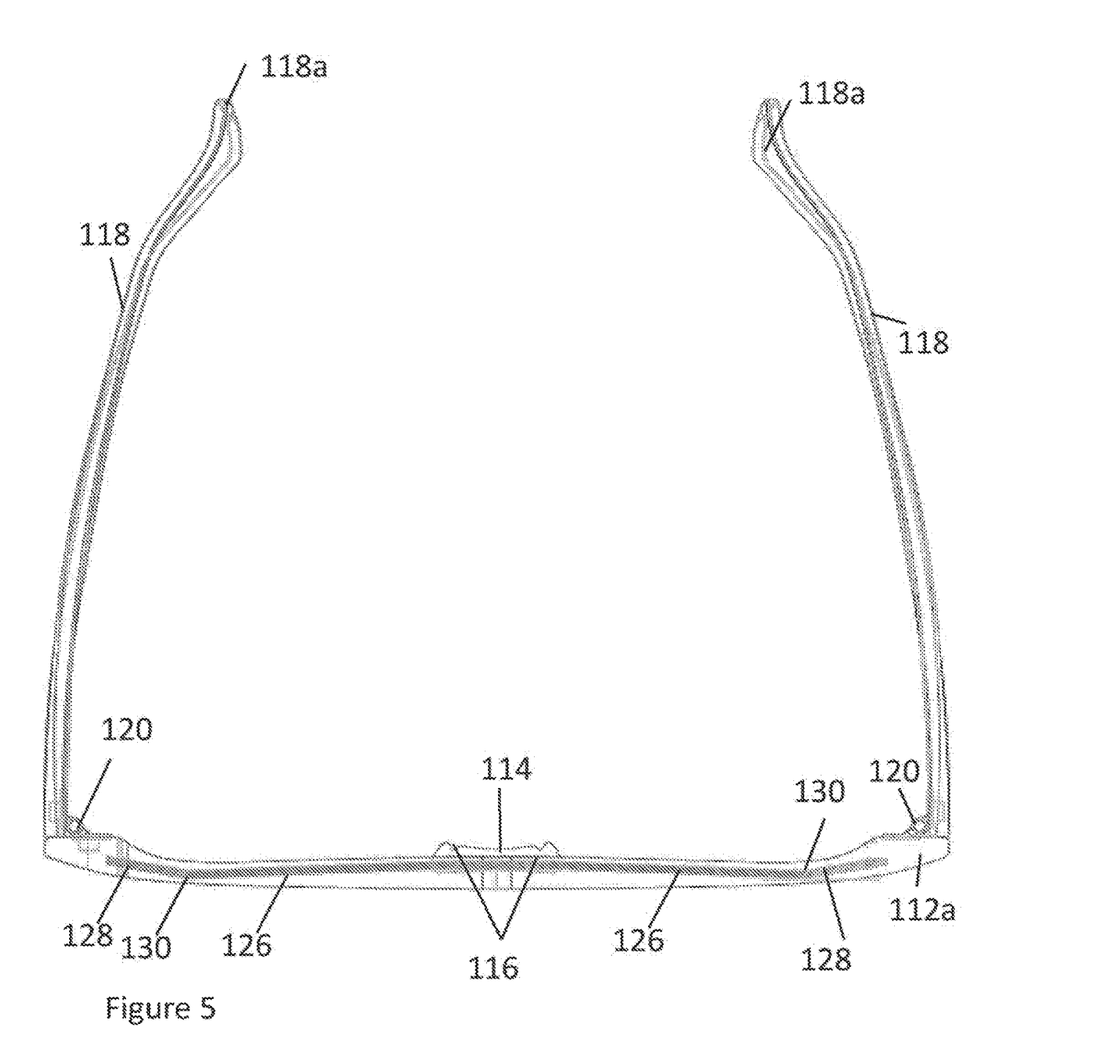
FIG. 5 is a schematic diagram illustrating a top view of the eyewear of FIG. 4.

Referring to FIGS. 4 and 5, in an alternative exemplary embodiment of the invention, frame 110 comprises a single lens support 112 which extends fully across the wearer's face (i.e. over the nose bridge), and a separate nose-bridge member 114 having downwardly extending bridge pads 116. A channel (not shown) runs along the whole length of the downwardly-facing surface of the lens support 112. A single lens 124 is provided and configured to frictionally engage with the channel. At the bottom edge of the single lens 124, an arced notch 124*a* is provided at a central region of the frame 110. The nose-bridge member 114 and bridge pads 116 are configured to fit within this notch 124*a*. A second channel (not shown), which runs along the inner surface of the nose-bridge member 114 and bridge pads 116 is configured to receive the lens notch 124*a*.

In this embodiment, the single lens 124 is equivalent to a pair of lenses 24 from the embodiment of FIGS. 1-3 that are connected together so as to form a single lens. The curvature of the single lens 124 thus has two discontinuities defining a centrally located forward-viewing portion 126 between the two discontinuities and two rearward-viewing portions 128 located on either side of the forward-viewing portion, toward the peripheral edges of the frame 110. The rearward-viewing portions 128 are angled toward the wearer relative to the forward-viewing portion 126, during use.

Similar to the previous embodiment, lens filters may be applied to the forward-viewing and rearward-viewing portions 126, 128 of the single lens 124. The single lens 124 can be removably fitted to the lens support 12, and the nose-bridge member 114 and bridge pads 116. As such, the wearer may interchange the single lens 124 and/or the nose-bridge member 114 as and when they desire.

Figure 6:
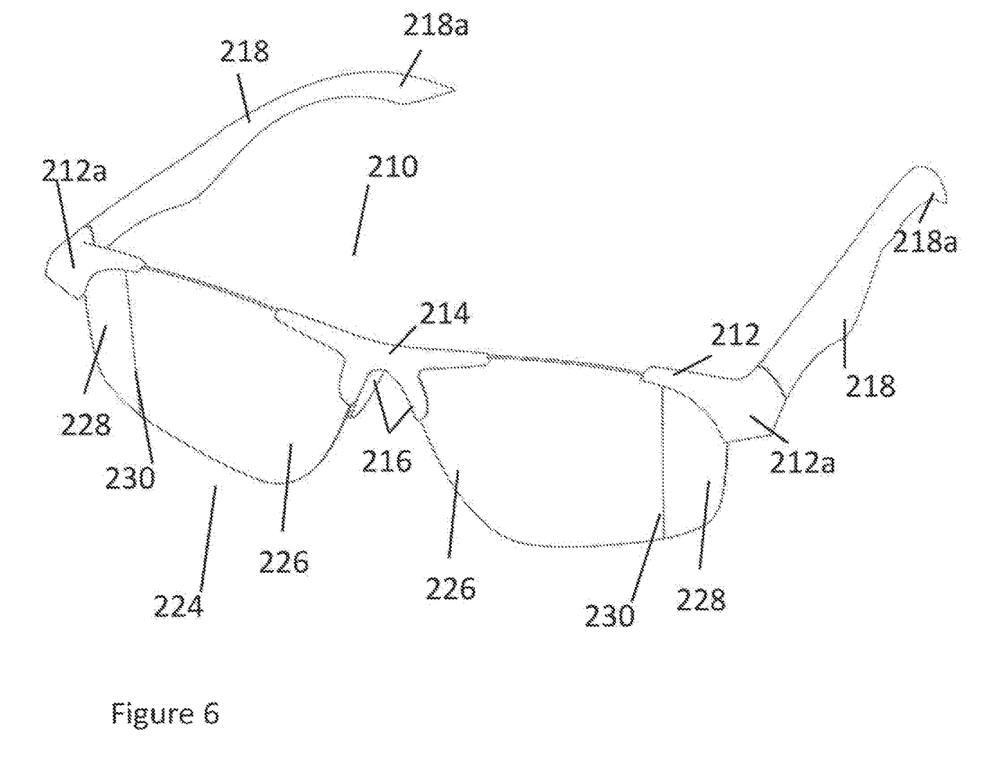
FIG. 6 is a schematic diagram illustrating a front perspective view of eyewear according to a third exemplary embodiment of the invention.

Referring to FIG. 6 of the drawings, in a further exemplary embodiment of the invention, the eyewear may comprise a pair of lenses 224, as described in the embodiment of FIGS. 1, 2 and 3, a pair of lens supports 212 and a nose-bridge member 214 having bridge pads 216. The lens supports 212 and nose-bridge member 214 are not connected to each other, and only fit together by means of frictional engagement with the respective lenses 224 via channels (not shown).

Regarding the specific shape of the lens/lenses and the frames, it will be understood by those skilled in the art that the lens/lenses and the frames may be adjusted according to aesthetic preference and that the invention is not limited in this regard. It will be understood to those skilled in the art that modifications and variations may be made to the above-described embodiments without departing from the scope of the appended claims. For example, in the above-described embodiments, the reflective coating covers the whole rearward surface of the rearward-viewing portion. However, the reflective coating does not necessarily have to cover the whole rearward surface of the rearward-viewing portion.

Instead, a reflective coating could be applied to only a portion of the reward-viewing portion (the remaining portion being transparent or translucent).

In other embodiments, the discontinuity may be curved going from the bottom edge of the lens 24 to the top edge of the lens 24, such that the forward-viewing portion or the rearward-viewing portion has a circular or oval shape.

In other embodiments, the discontinuity need not necessarily divide the lens vertically, but could be angled or curved relative to the vertical axis.

In other embodiments, the discontinuity need not extend across the whole height of the lens. Instead, the discontinuity may extend only partially between two opposing edges of the lens. In some cases, the discontinuity may even isolate a portion within the first portion of the lens.

In the context of this specification "comprising" is to be interpreted as "including".

Aspects of the invention comprising certain elements are also intended to extend to alternative embodiments "consisting" or "consisting essentially" of the relevant elements.

Where technically appropriate, embodiments of the invention may be combined.

Embodiments are described herein as comprising certain features/elements. The disclosure also extends to separate embodiments consisting or consisting essentially of said features/elements.

Technical references such as patents and applications are incorporated herein by reference.

Any embodiments specifically and explicitly recited herein may form the basis of a disclaimer either alone or in combination with one or more further embodiments.

What is claimed is:

1. A lens for eyewear, wherein: a curvature of the lens has a discontinuity, the discontinuity defining a first portion of the lens on one side of the discontinuity, and a second portion of the lens on another side of the discontinuity, the second portion thereby being angled relative to the first portion;
    wherein the first portion is transparent or translucent and the second portion has a reflective side being at least partially reflective;
    wherein an angle subtended between a surface of the lens on the reflective side of the second portion and an adjacent surface of the first portion is obtuse;
    wherein the reflective side of the second portion comprises a reflective coating and the reflective coating is partially reflective; and
    wherein the reflective coating partially covers the reflective side of the second portion.

2. The lens according to claim 1, wherein the angle is between 160° and 179.5°.

3. The lens according to claim 1, wherein the discontinuity is substantially linear.

4. The lens according to claim 1, wherein the discontinuity is non- linear.

5. The lens according to claim 1, wherein the discontinuity extends across a whole height of the lens.

6. The lens according to claim 1, wherein a surface area of the second portion is between about 10-35% of a surface area of the lens.

7. The lens according to claim 1, wherein the reflective coating covers the whole of the reflective side of the second portion.

8. The lens according to claim 1, wherein a remaining portion of the second portion that is not covered by the reflective coating is transparent or translucent.

9. The lens according to claim 1, wherein the lens comprises a filter for blocking particular wavelengths of light.

10. The lens according to claim 1, wherein the first portion and the second portion are substantially flat and planar and the plane of the first portion intersects the plane of the second portion at the discontinuity.

11. The lens according to claim 1, wherein a shape of the lens is generally circular, oval, square, rectangular or teardrop.

12. Eyewear comprising:
    at least one lens, wherein a curvature of the at least one lens has a discontinuity, the discontinuity defining a first portion of the lens on one side of the discontinuity, and a second portion of the lens on another side of the discontinuity, the second portion thereby being angled relative to the first portion;
    wherein the first portion is transparent or translucent and the second portion has a reflective side;
    wherein an angle between the surface on the reflective side of the second portion and an adjacent surface of the first portion is obtuse;
    wherein the reflective side of the second portion comprises a reflective coating and the reflective coating is partially reflective;
    wherein the reflective coating partially covers the reflective side of the second portion; and
    a frame configured to support the or each lens such that the first portion is located toward a central region of the frame, the second portion is located toward a peripheral region of the frame, and the second portion is angled toward the wearer relative to the first portion when in use, such that the reflective side of the second portion faces the wearer in use.

13. Eyewear according to claim 12, wherein the discontinuity is orientated substantially vertically with respect to the wearer when in use.

14. Eyewear according to claim 12, wherein the or each lens is releasably supported by the frame.

15. Eyewear according to claim 12, comprising two lenses according to claim 1 arranged symmetrically about the central region of the frame.

16. Eyewear according to claim 15, further comprising a nose-bridge member arranged in the central region of the frame, wherein each lens is arranged on opposing sides of the nose-bridge member.

17. Eyewear according to claim 16, wherein the nose-bridge member is releasably attachable to the frame.

18. Eyewear according to claim 12, further comprising securing means for securing the frame to a wearer's head in use.

19. Eyewear according to claim 18, wherein the securing means comprise a pair of arms hingedly mounted to the frame for extending over the ears of the wearer when in use.

* * * * *